(12) United States Patent
Hanson et al.

(10) Patent No.: US 6,854,473 B2
(45) Date of Patent: Feb. 15, 2005

(54) METHOD AND APPARATUS FOR EXECUTING PLURAL PROCESSES ON A MICROELECTRONIC WORKPIECE AT A SINGLE PROCESSING STATION

(75) Inventors: Kyle M. Hanson, Kalispell, MT (US); Reed A. Blackburn, Whitefish, MT (US)

(73) Assignee: Semitool, Inc., Kalispell, MT (US)

( * ) Notice: Subject to any disclaimer, the term of this patent is extended or adjusted under 35 U.S.C. 154(b) by 305 days.

(21) Appl. No.: 09/836,844

(22) Filed: Apr. 17, 2001

(65) Prior Publication Data

US 2002/0020622 A1 Feb. 21, 2002

Related U.S. Application Data

(63) Continuation of application No. 09/416,235, filed on Oct. 12, 1999, now abandoned.

(51) Int. Cl.⁷ .............................. B05B 12/02; B05B 3/00
(52) U.S. Cl. ................... 134/95.3; 134/58 R; 134/94.1; 134/95.1; 134/95.2; 134/103.2; 134/198; 134/902; 422/292; 422/300
(58) Field of Search ................................. 204/199, 212, 204/224 R, 225, 232, 237, 263, 275.1, 297.01, 297.06, 297.07, 297.08; 422/292, 300; 134/58 R, 94.1, 95.1, 95.2, 95.3, 103.2, 198, 902

(56) References Cited

U.S. PATENT DOCUMENTS

| | | | |
|---|---|---|---|
| 3,950,184 A | * | 4/1976 | Adams et al. ................ 134/10 |
| 5,169,408 A | * | 12/1992 | Biggerstaff et al. ........ 29/25.01 |
| 5,344,491 A | | 9/1994 | Katou |
| 5,421,987 A | | 6/1995 | Tzanavarat et al. |
| 5,447,615 A | | 9/1995 | Ishida |
| 5,871,584 A | * | 2/1999 | Tateyama et al. ........... 118/323 |
| 5,932,077 A | | 8/1999 | Reynolds |
| 6,050,275 A | * | 4/2000 | Kamikawa et al. ......... 134/105 |
| 6,080,291 A | | 6/2000 | Woodruff et al. |
| 6,099,702 A | | 8/2000 | Reid et al. |
| 6,139,703 A | | 10/2000 | Hanson et al. |
| 6,156,167 A | * | 12/2000 | Patton et al. ................ 204/270 |
| 6,214,193 B1 | * | 4/2001 | Reid et al. .................. 205/122 |
| 6,280,581 B1 | * | 8/2001 | Cheng ..................... 204/224 R |
| 6,352,623 B1 | * | 3/2002 | Volodarsky et al. ...... 204/275.1 |
| 6,391,166 B1 | * | 5/2002 | Wang ..................... 204/224 R |
| 6,416,647 B1 | * | 7/2002 | Dordi et al. ................. 205/137 |
| 2003/0079989 A1 | * | 5/2003 | Klocke et al. .............. 204/471 |

* cited by examiner

Primary Examiner—Nam Nguyen
Assistant Examiner—Brian L. Mutschler
(74) Attorney, Agent, or Firm—Perkins Coie LLP (57) ABSTRACT

An apparatus for processing a microelectronic workpiece is set forth. The apparatus comprises a workpiece support adapted to hold the microelectronic workpiece and a processing container adapted to receive the microelectronic workpiece held by the workpiece support. A drive mechanism is connected to drive the processing container and the workpiece support relative to one another so that the microelectronic workpiece may be moved to a plurality of workpiece processing positions for processing using processing fluid that is provided by first and second chemical delivery systems. The apparatus also includes first and second chemical collector systems that are used to assist in at least partially removing spent processing fluid. In accordance with one embodiment, the apparatus is particularly adapted to execute an immersion process, such as electroplating, and a spraying process, such as an in-situ rinse.

47 Claims, 6 Drawing Sheets

METHOD AND APPARATUS FOR EXECUTING PLURAL PROCESSES ON A MICROELECTRONIC WORKPIECE AT A SINGLE PROCESSING STATION

CROSS-REFERENCE TO RELATED APPLICATIONS

Not Applicable

This application is a continuation of U.S. application Ser. No. 09/416,235 filed on Oct. 12, 1999, now abandoned.

STATEMENT REGARDING FEDERALLY SPONSORED RESEARCH OR DEVELOPMENT

Not Applicable

BACKGROUND OF THE INVENTION

The fabrication of microelectronic components from a workpiece, such as a semiconductor wafer substrate, polymer substrate, etc., involves a substantial number of processes. There are a number of different processing operations performed on the workpiece to fabricate the microelectronic component(s). Such operations include, for example, material deposition, patterning, doping, chemical mechanical polishing, electropolishing, and heat treatment.

Material deposition processing involves depositing thin layers of electronic material to the surface of the workpiece (hereinafter described as, but not limited to, a semiconductor wafer). Patterning provides removal of selected portions of these added layers. Doping of the semiconductor wafer is the process of adding impurities known as "dopants" to the selected portions of the wafer to after the electrical characteristics of the substrate material. Heat treatment of the semiconductor wafer involves heating and/or cooling the wafer to achieve specific process results. Chemical mechanical polishing involves the removal of material through a combined chemical/mechanical process while electropolishing involves the removal of material from a workpiece surface using electrochemical reactions.

Numerous processing devices, known as processing "tools", have been developed to implement the foregoing processing operations. These tools take on different configurations depending on the type of workpiece used in the fabrication process and the process or processes executed by the tool. One tool configuration, known as the Equinox(R) wet processing tool and available from Semitool, Inc., of Kalispell, Mont., includes one or more workpiece processing stations that utilize a workpiece holder and a process bowl or container for implementing wet processing operations. Such wet processing operations include electroplating, etching, cleaning, electroless deposition, electropolishing, etc.

In accordance with one configuration of the foregoing Equinox(R) tool, the workpiece holder and the process bowl are disposed proximate one another and function to bring the semiconductor wafer held by the workpiece holder into contact with a processing fluid disposed in the process bowl and forming a processing chamber.

Conventional workpiece processors have utilized various techniques to bring the processing fluid into contact with the surface of the workpiece in a controlled manner. For example, the processing fluid may be brought into contact with the surface of the workpiece using a controlled spray. In other types of processes, such as in partial or full immersion processing, the processing fluid resides in a bath and at least one surface of the workpiece is brought into contact with or below the surface of the processing fluid.

BRIEF SUMMARY OF THE INVENTION

An apparatus for processing a microelectronic workpiece is set forth. The apparatus comprises a workpiece support adapted to hold the microelectronic workpiece and a processing container adapted to receive the microelectronic workpiece held by the workpiece support. A drive mechanism is connected to drive the processing container and the workpiece support holding the microelectronic workpiece relative to one another so that the microelectronic workpiece may be moved to a plurality of workpiece processing positions. At least two chemical delivery systems are employed. A first chemical delivery system is used to provide at least one processing fluid to the processing container for application to the microelectronic workpiece when the microelectronic workpiece is in a first one of the plurality of workpiece processing positions while a second chemical delivery system is used to provide at least one processing fluid to the processing container for application to the microelectronic workpiece when the microelectronic workpiece is in a second one of the plurality of microelectronic workpiece processing positions. The apparatus also includes at least two chemical collector systems. A first chemical collector system is used to assist in at least partially removing spent processing fluid provided by the first chemical delivery system while the microelectronic workpiece is in the first one of the plurality of workpiece processing positions. Similarly, a second chemical collector system is used to assist in at least partially removing spent processing fluid provided by the second chemical delivery system from the processing container while the microelectronic workpiece is in the second one of the plurality of microelectronic workpiece processing positions. In accordance with one embodiment, the apparatus is particularly adapted to execute an immersion process, such as electroplating, and a spraying process, such as an in-situ rinse.

DETAILED DESCRIPTION OF THE INVENTION

Figure 1:
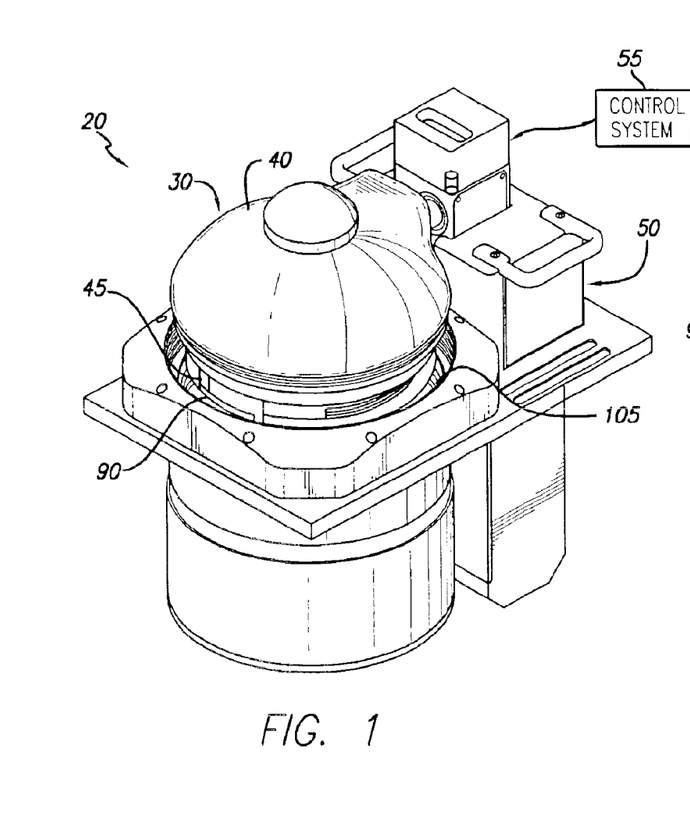
FIG. 1 is a perspective view of a reactor constructed in accordance with one embodiment of the present invention.
Figure 2:
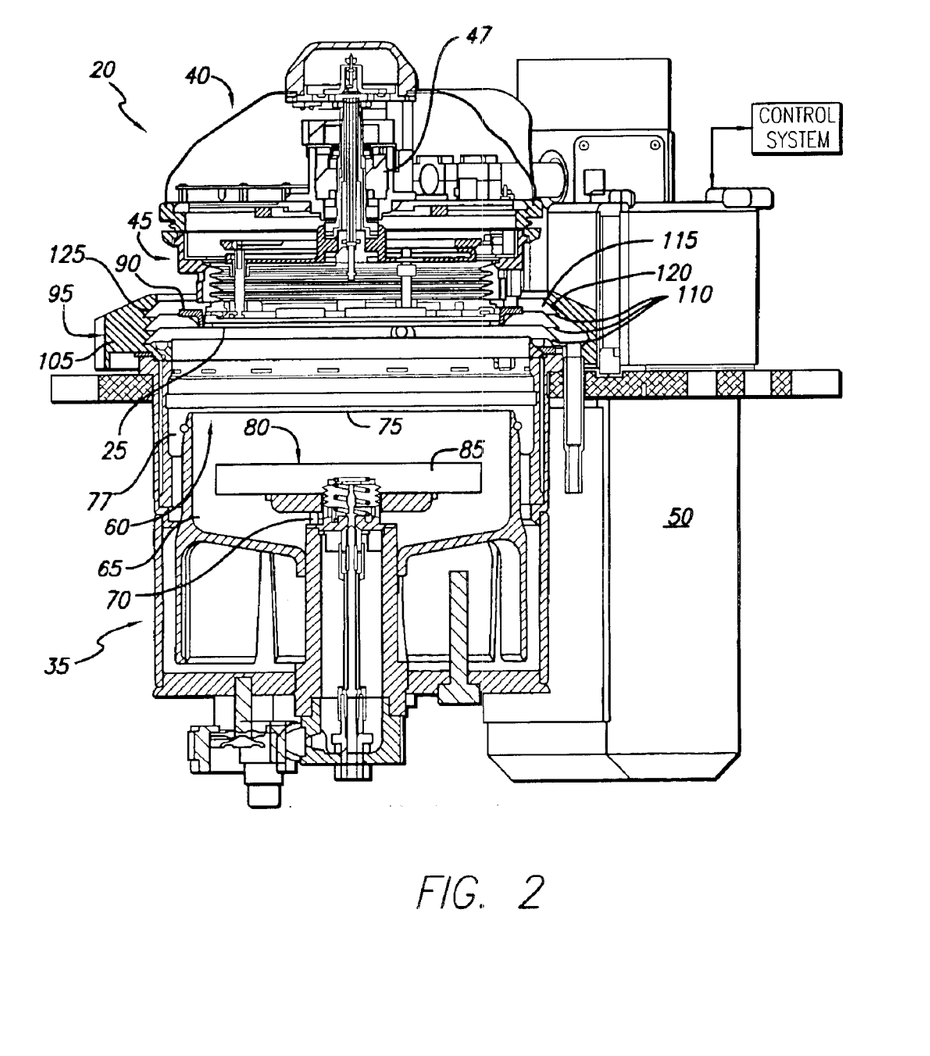
FIG. 2 is a cross-sectional view of the reactor illustrated in FIG. 1.
Figure 3:
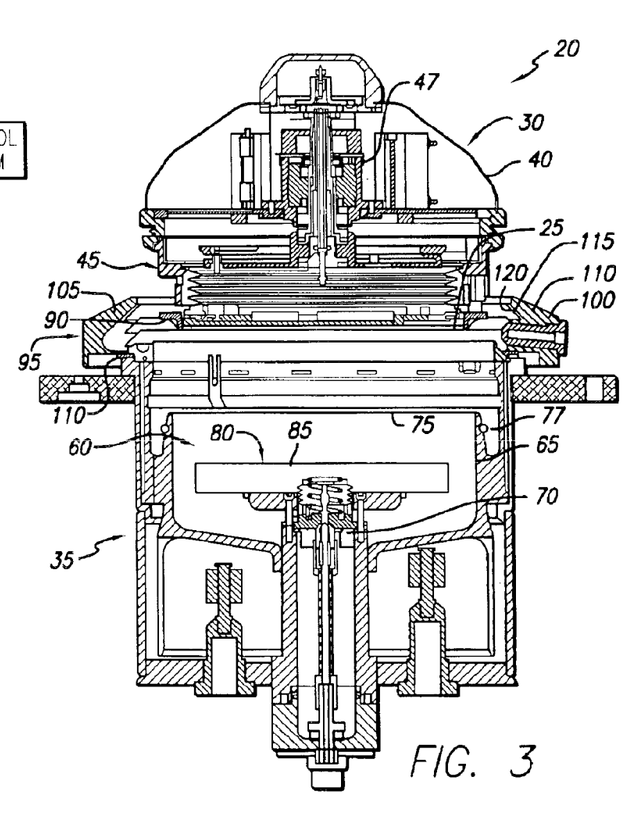
FIG. 3 is a further cross-sectional view of the reactor illustrated in FIG. 1.

With reference to FIGS. 1–3, there is shown a reactor assembly 20 for processing a microelectronic workpiece, such as a semiconductor wafer 25 or the like. Generally stated, the reactor assembly 20 is comprised of a reactor head, shown generally at 30, that includes one or more components used to support the workpiece 25. Additionally, the reactor assembly 20 includes a corresponding reactor container, shown generally at 35, that receives one or more processing fluids from one or more chemical delivery systems.

The reactor head 30 of the reactor 20 is preferably comprised of a stationary assembly 40 and, optionally, a rotor assembly 45 that is driven by a corresponding rotor motor 47. Rotor assembly 45 may be configured to receive and carry an associated wafer 25 or like workpiece, position the workpiece in a process-side down orientation within reactor container 35, and to rotate or spin the workpiece. The rotor assembly 45 and/or reactor head 30 may also be used to elevate the workpiece after initial contact with a processing liquid so that only a meniscus of the processing fluid contacts the side of the workpiece that is to be processed. This also falls within the ambit of an immersion process.

The reactor head 30 is mounted on a lift/rotate apparatus 50 which is configured to rotate the reactor head 30 from an upwardly-facing disposition in which it receives the wafer to be plated, to a downwardly facing disposition in which the surface of the wafer to be processed is positioned so that it may be brought into contact with a processing fluid, such as an electroplating solution, in reactor container 35. A robotic arm (not illustrated), which may include an end effector, is typically employed for placing the workpiece 25 in position on the rotor assembly 45, and for removing the processed wafer from within the rotor assembly 45 after processing is complete.

Lift/rotate apparatus 50 is preferably capable of moving the workpiece 25 to a plurality of positions with respect to reactor container 35. More particularly, the lift/rotate apparatus 50 may be capable of moving the reactor head 30 and the corresponding workpiece 25 in a vertical fashion toward and away from the reactor container 35. Such vertical motion may be directed by a programmable control system 55 or the like. Programmable control system 55 may also be used to adjust the spin rate of the rotor motor 47.

Although lift/rotate apparatus 50 of the disclosed embodiment has the ability to rotate reactor head 30 for presentation of the workpiece 25 by a corresponding robot in a process-side up orientation, it will be recognized that apparatus 50 need not have such rotation abilities. Rather, the workpiece 25 may be presented to the reactor head 30 by the corresponding robot in a process-side down orientation. In such instances, rotation of the workpiece to the process-side down orientation may take place on the corresponding robot or another apparatus within the overall processing system.

The reactor container 35 includes a first processing portion, shown generally at 60, that is configured to execute a first process in which one or more processing fluids are delivered to treat at least one surface of the workpiece 25. In the illustrated embodiment, for exemplary purposes, first processing portion 60 of container 35 is configured to execute an electroplating process. However, the first processing portion 60 of container 35 may be alternatively configured to execute any number of different processes. Such processes include, but are not limited to, immersion processes, vapor processes, spray processes, gaseous processes, etc.

Pursuant to executing an electroplating process in the first processing portion 60, container 35 is configured to provide a flow of an electroplating solution to one or more surfaces of the workpiece 25. To this end, container 35 includes an interior container 65 having an inlet 70 through which a flow of electroplating solution is provided. The electroplating solution provided through inlet 70 flows through the interior container 65 and overflows therefrom about an upper weir 75 into an exterior overflow region 77. This type of reactor assembly is particularly suited for effecting electroplating of semiconductor wafers or like workpieces, in which an electrically conductive, thin-film layer of the wafer is electroplated with a blanket or patterned metallic layer while in a process-side down orientation.

Within the interior container 65 there is an anode assembly, shown generally at 80, having one or more anodes 85 that is in the electrical contact with the electroplating solution (although the illustrated embodiment utilizes a single anode 85). The one or more anodes 85 are electrically connected to a source of electroplating power (not shown) through one or more electric conductive structures. The anode assembly 80 may be constructed in the manner set forth in PCT Application No. PCT/US99/15430, entitled "REACTOR VESSEL HAVING IMPROVED CUP, ANODE AND CONDUCTOR ASSEMBLY", filed Jul. 9, 1999, the teachings of which are hereby incorporated by reference. An alternative reactor container suitable for immersion processing is set forth in U.S. Ser. No. 60/143, 769, entitled "workpiece processor having improved processing chamber", filed Jul. 12, 1999.

In those instances in which the reactor is to be used in an electroplating process, the rotor assembly 45 of head 30 may include one or more cathode contacts that provide electroplating power to the surface of the wafer. In the illustrated embodiment, a cathode contact assembly is shown generally at 90. This cathode contact assembly may be constructed in accordance with the teachings of PCT Application No. PCT/US99/15847, entitled "METHOD AND APPARATUS FOR COPPER PLATING USING ELECTROLESS PLATING AND ELECTROPLATING", filed Jul. 12, 1999. Although the various contact configurations illustrated in that patent application provide electroplating power directly to the side of the wafer that is to be processed, it will be recognized that backside contact may be implemented in lieu of front side contact when the substrate is conductive or other means are provided to electrically connect the backside of the of the workpiece with the process side thereof. The contact assembly 90 may be operated between an open state that allows the wafer to be place don the rotor assembly 45, and a closed state that secures the wafer to the rotor assembly and brings the electrically conductive components of the contact assembly 90 into electrical engagement with the surface of the wafer that is to be plated.

Processing container 35 also includes a second processing portion, shown generally at 95, that is adapted to execute a further process on one or more surfaces of the microelectronic workpiece 25. In the illustrated embodiment, the second processing portion 95 is adapted to execute a process in which a processing fluid is provided at the downward facing surface of the workpiece 25. To this end, one or more nozzles 100 are provided in the second processing portion 95 and are directed toward the workpiece 25.

It is often desirable to at least partially inhibit mixing of the processing chemicals used in different processing steps. Reactor container 35 therefore includes separate collection systems for collecting spent processing fluids (e.g., processing fluids that have contacted one or more surfaces of the workpiece 25). With respect to the illustrated embodiment, the processing fluids used in processes carried out in the first processing portion 60 of reactor container 35 are liquids that overflow the weir 75 of the interior container 65 and enter the overflow region 77. After entering the overflow region 77, the processing chemicals are removed through one or more outlets that are in fluid communication with the overflow region 77. The fluid exiting from the reactor container 35 subsequently undergoes disposal, recycling, constituent dosing, etc.

In those instances in which the processing fluid used in the first processing portion 60 is in a gaseous or vapor state, overflow region 77 may be connected to a vacuum source. Spent processing fluid may then be removed as it overflows the weir 75. As above, process fluid exiting from the reactor container 35 may subsequently undergo disposal, recycling, constituent dosing, etc.

A further collection system is used for collecting spent processing fluids employed in processes carried out in the second processing portion 95. The further collection system, generally designated at 105, is provided in or proximate the second processing portion 95. In the illustrated embodiment, the first processing portion 60 of reactor container 35 is disposed vertically below the second processing portion 95 and, further, is open to the second processing portion 95. These factors complicate the collection process as it is to be executed by the further collection system. For example, if a liquid is used as the processing fluid in the second processing portion 95 and delivered to a surface of the microelectronic workpiece 25, liquid drops can readily enter and adversely effect the first processing portion 60. Although small amounts of the liquid may be tolerated in the first processing portion 60, the substantial amounts of the liquid that are often introduced during spray processing or like can and often will reduce the effectiveness of the processing that takes place in the first processing portion 60.

To overcome the foregoing problems, the further collection system 105 is in the form of one or more fluid channels, shown generally at 110, that are disposed at the inner periphery of reactor container 35. As shown, the fluid channels 110 are located in the second processing portion 95 proximate the position of the workpiece 25 as it undergoes processing in the second processing portion 95. Each fluid channel, as illustrated in FIGS. 2 and 3, may be defined by a splash wall 115 and a retainer wall 120. The splash wall 115 and retainer wall 120 may each be disposed at an angle with respect to horizontal. The manner in which this further collection system functions will become clearer in connection with the operational description below.

Figure 4:
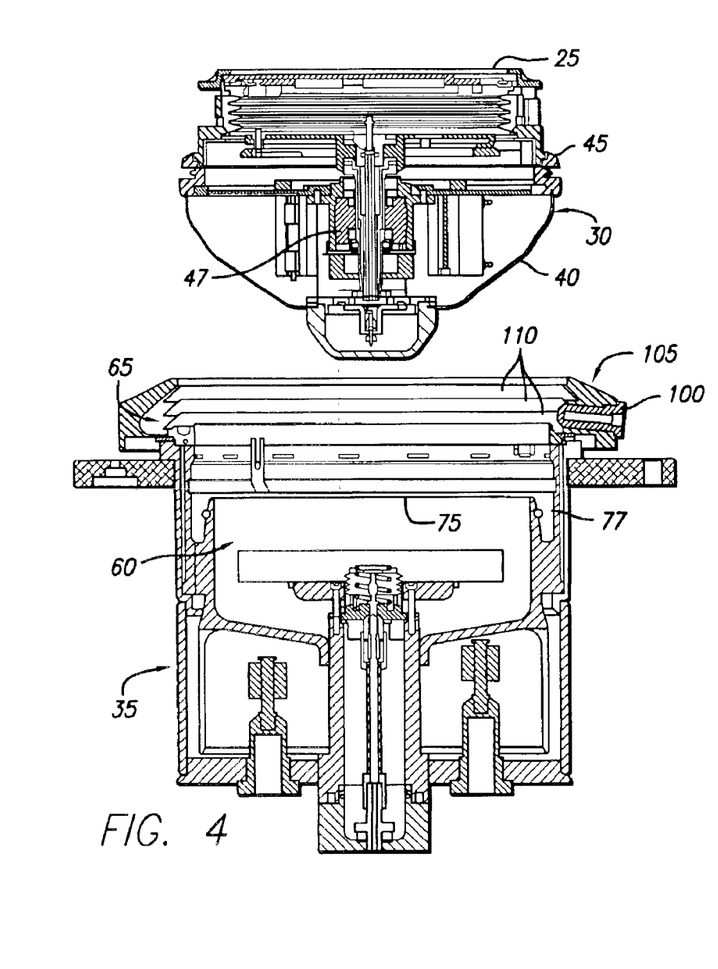
FIGS. 4 and 5 illustrate the orientation of the processing head and corresponding workpiece during a workpiece loading operation.

In operation, the reactor head 30 is elevated and rotated by the lift/rotate apparatus 50 to a loading position, illustrated in FIG. 4, that is located above the reactor container 35. While in this position, a workpiece 25 is placed upon rotor assembly 45 with the side of the workpiece that is to be electroplated facing upward. The contact assembly 90 of the rotor assembly 45 is then actuated to grip the workpiece 25 and secure it therewith. This actuation also causes the contact assembly 90 to make electrical contact with the workpiece 25 to supply power for the electroplating operation. As noted above, however, rotation of the reactor head 30 need not take place in apparatus in which the workpiece 25 is rotated to a process-side down position prior to introduction of the workpiece 25 to the rotor assembly 45.

Figure 5:
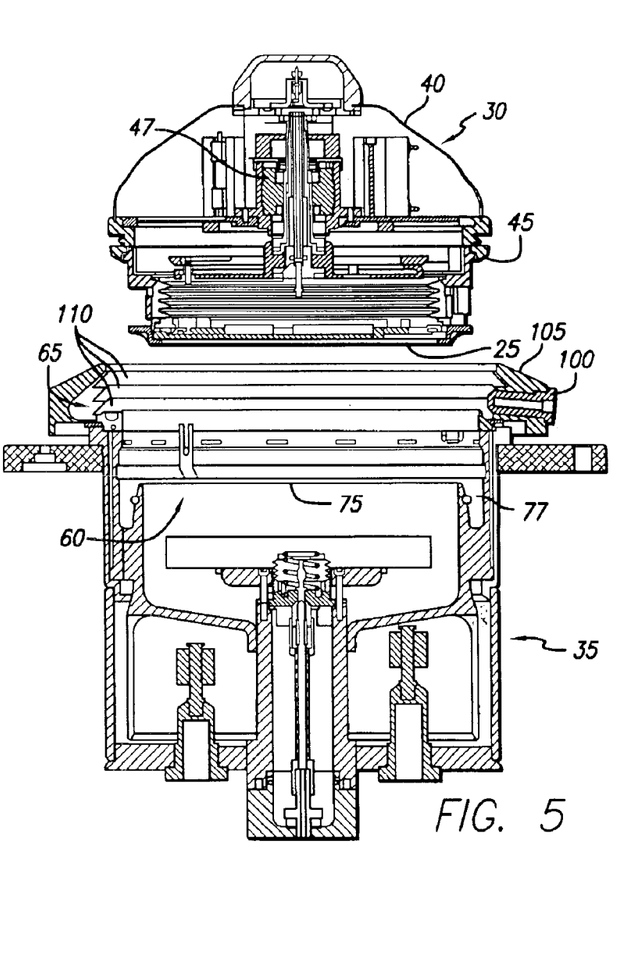
Figure 6:
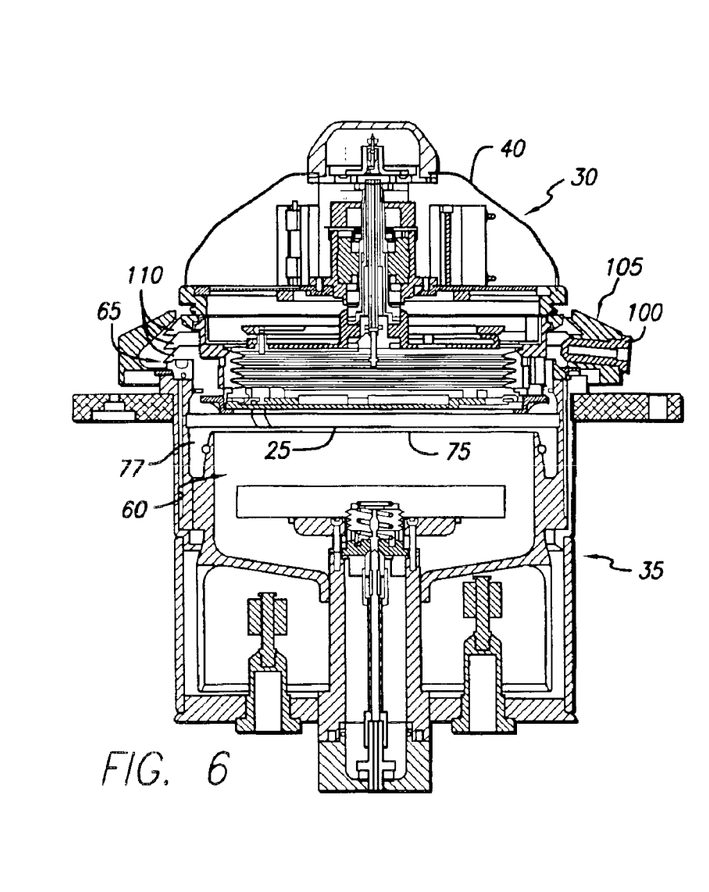
FIGS. 6–9 are cross-sectional views of the reactor of FIG. 1 illustrating the microelectronic workpiece at various processing positions within the processing container.

Once the workpiece 25 has been secured with the rotor assembly 45, the lift/rotate apparatus 50 is directed by the control system 55 to rotate the reactor head 30 so that the surface of the workpiece that is to be processed is faced downward, as illustrated in FIG. 5. With the workpiece 25 in this state, the control system 55 directs the lift/rotate apparatus 50 to drive the rotor assembly 45 and the corresponding workpiece to a first workpiece processing position within the reactor container 35. This first workpiece processing position may be located in either the first processing portion 60 or the second processing portion 95 of the reactor container 35. For exemplary purposes, it will be assumed that processing will first take place in the first processing portion 60. As such, the lift/rotate apparatus 50 is directed by the control system 55 to take the necessary steps to bring the workpiece 25 to the position illustrated in FIG. 6. In this position, at least the lower surface of the workpiece 25 is brought into contact with a flow of electroplating solution provided at the upper portion of interior container 65. Electroplating power is then provided to both the workpiece 25 and the anode 85 to affect electroplating of the surface. During the electroplating process, spent processing fluid is collected within the overflow region 77 and removed from the reactor container 35.

Figure 7:
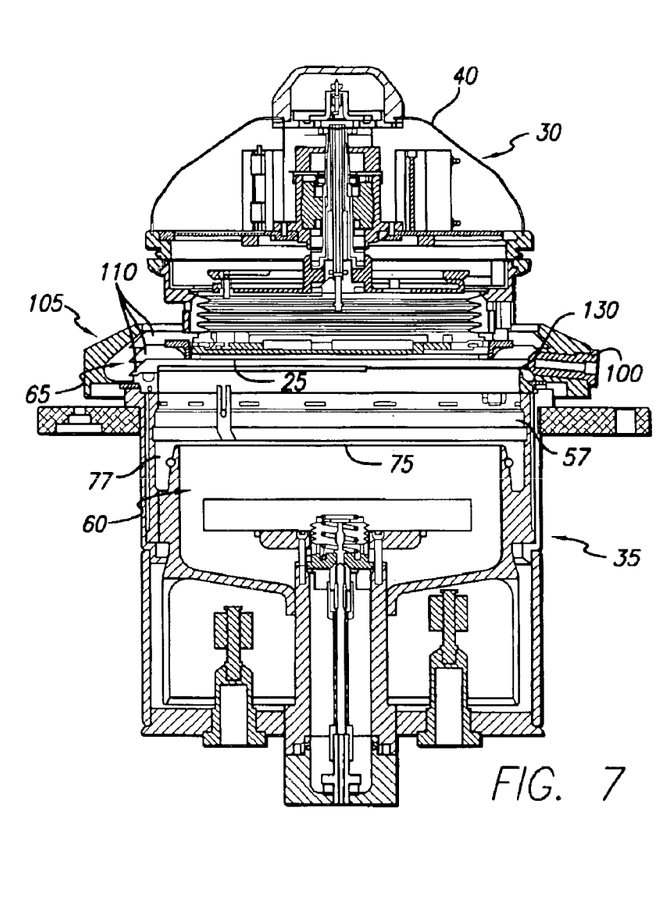

Once electroplating is completed in the first processing portion 60, the control system 55 directs the lift/rotate apparatus 50 to move the workpiece 25 to an intermediate position, designated generally at 57 of FIG. 7. While at this position, the workpiece 25 is spun at a high rotation rate to fling off a bulk portion of any excess electroplating solution. This reduces drag out and waste of the electroplating solution.

After the bulk portion of the excess electroplating solution has been flung off, the control system 55 directs the lift/rotate apparatus 50 to move the workpiece 25 to a second processing position. Here, in the exemplary process, the second processing position is located in the second processing portion 95 of the reactor container 35. The lift/rotate apparatus 50 thus drives the workpiece 25 to the position illustrated in FIG. 7. In this position, one or more further processing chemicals are provided from a chemical supply system to contact one or more surfaces of the workpiece 25. With respect to the specific embodiment disclosed herein, a liquid stream of a processing fluid, such as water that may or may not include additives, is provided through the one or more nozzles 100 to contact the lower surface of the workpiece 25 that has been electroplated. As the liquid stream is directed toward the workpiece surface, the rotor assembly 45 and corresponding workpiece 25 are rotated at a high rotation rate so that the liquid impinging on the workpiece surface is flung radially outward therefrom under the influence of centripetal acceleration. The liquid flung in this manner is collected by the further collection system 105. More particularly, the liquid flung in this manner contacts the splash wall 115 corresponding to the channel 110 that is immediately adjacent the lower surface of the workpiece 25, and proceeds downward therealong into the corresponding channel 110. Retainer wall 120, being disposed at an angle with respect to horizontal, assists in retaining the accumulated liquid within the corresponding channel 110. One or more outlets 125 are placed in fluid communication with the channel 110 to allow the spent processing liquid to be removed from the reactor container 35. As such, the spent processing liquid used in the second processing portion 95 is effectively removed from the reactor container 35 by the further collection system 105, thereby minimizing the amount of the spent liquid that enters the first processing portion 60.

As can be seen in the FIGUREs, a plurality of collection channels 110 may be used. In accordance with one embodiment of the present invention, all of the plurality of collection channels 110 can be connected to a common drain. Such a configuration is particularly useful in those instances in which a single processing fluid is employed for processing the workpiece when it is in the second processing portion 95. However, it may be desirable to process the workpiece 25 using more than one type of processing fluid in the second processing portion 95 while collecting the processing fluids separately. To this end, programmable control system 55 directs the lift/rotate apparatus 50 to a plurality of positions within the second processing portion 95. Here, those positions differ with respect to their vertical position within the reactor container 35.

Figure 8:
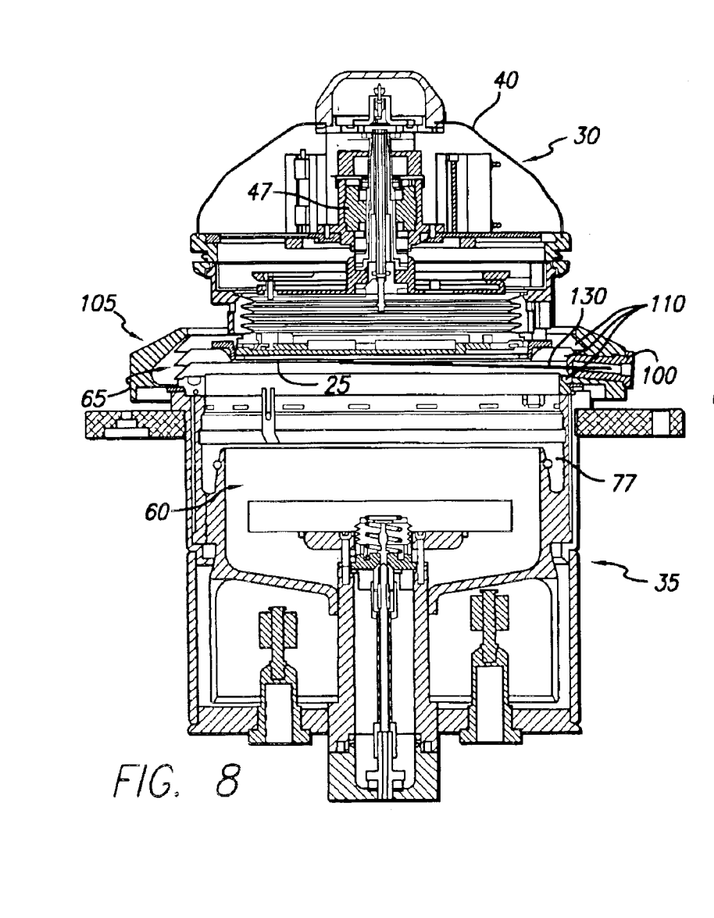
Figure 9:
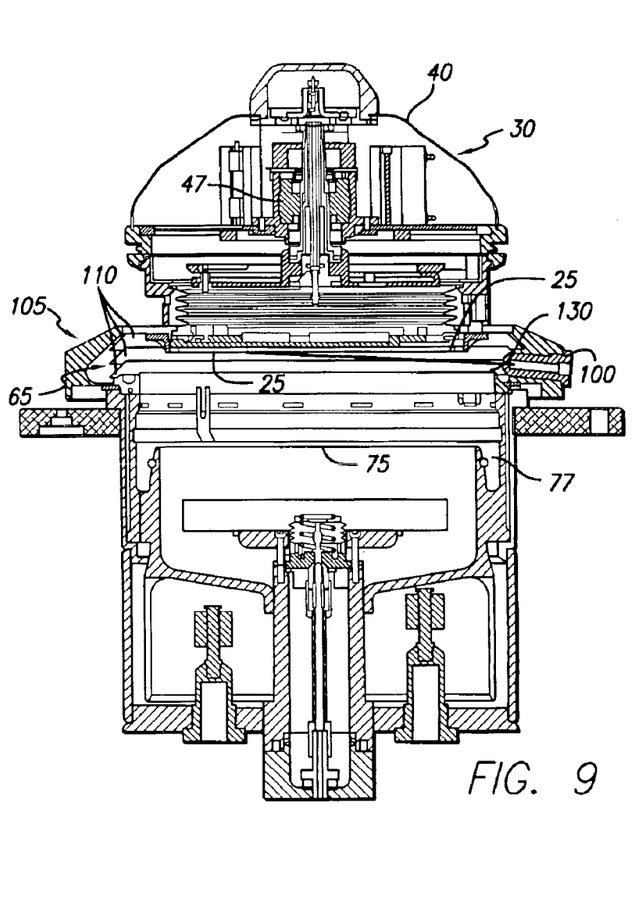

A unique manner of delivering a fluid stream to the surface of a workpiece is illustrated in connection with FIGS. 7–9 As illustrated, the workpiece 25 is moved to a plurality of processing positions within the second processing portion 95. With reference to FIG. 7, the reactor head 30 is driven by the control system 55 to place the workpiece 25 at a first processing position within the second processing portion 95. In this position, nozzle 100 directs a stream of processing fluid 130 toward a central portion of the lower surface of the workpiece 25 at an upward angle. As the stream of processing fluid 130 is provided to the surface of workpiece 25, the control system 55 directs the reactor head 30 to move the workpiece 25 sequentially through the positions illustrated in FIGS. 7 through 9. Such movement through these positions can be executed in accordance with a controlled continuous velocity, a controlled velocity profile, or in discrete steps. As the workpiece 25 is moved to these various processing positions, the stream of processing fluid 130 from nozzle 100 is directed at a substantially fixed point in space. Since the stream 130 is fixed at an acute angle as the workpiece 25 is moved, the radial position at which the stream 130 contacts the workpiece 25 changes and approaches the periphery of the surface of workpiece 25. This is particularly useful when this apparatus configuration and method of operation are used in connection with electroplating operations, since the stream 130 may be comprised of deionized water and effectively "chase off" electroplating solution from surface of microelectronic workpiece 25.

As can be seen in the foregoing figures, a plurality of channels 110 are employed. Each channel 110 corresponds to one or more processing positions assumed by the workpiece 25 as it is processed in the second processing portion 95. In those instances in which a single processing fluid is used in the second processing portion 95, the channels 110 may be connected together and tied to a single outlet 135. However, it is also possible to provide different processing fluids to the surface of the workpiece 25 at different processing positions within the second processing portion 95. In such operations, channels 110 may be used to separately collect each of the processing fluids and provide them to separate outlets.

Figure 10:
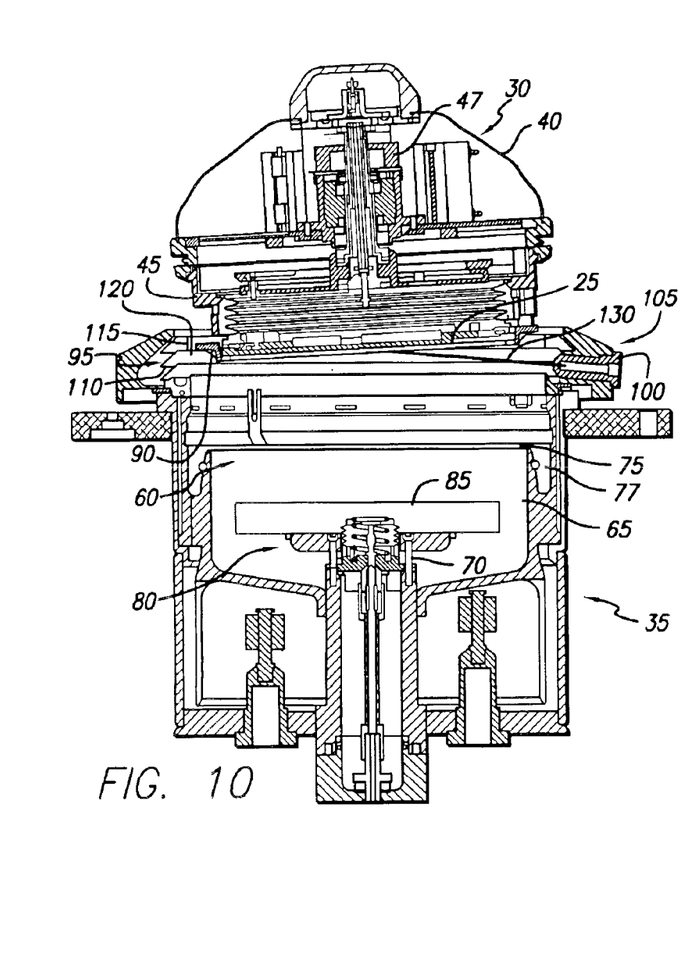
FIGS. 10 and 11 are cross-sectional views of the reactor of FIG. 1 illustrating the microelectronic workpiece at various angular positions within the second processing portion of the processing container so as to vary the position of initial contact of a stream of processing fluid with a surface of the microelectronic workpiece.
Figure 11:
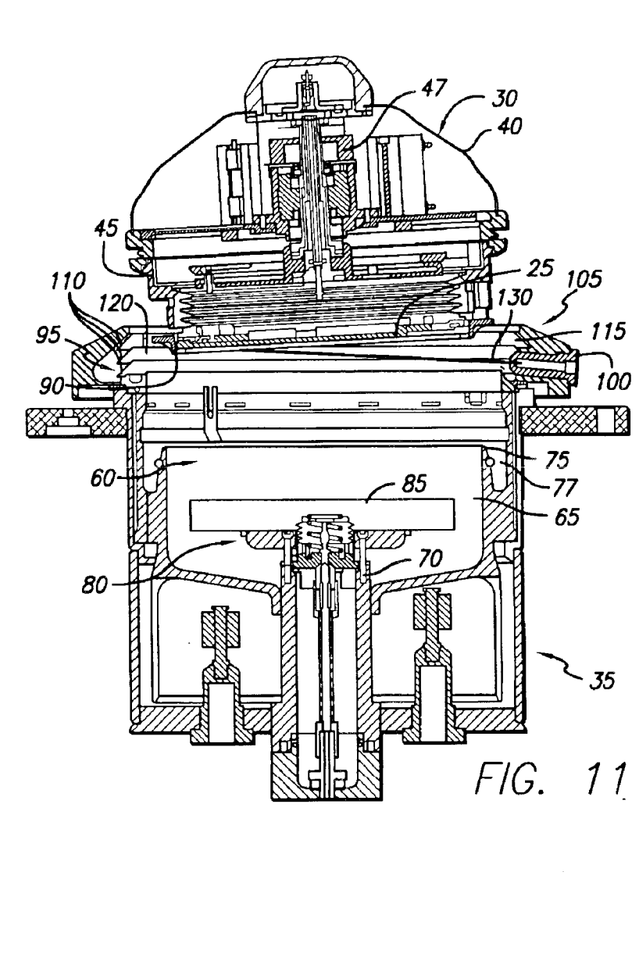

An alternative method (or additional method, if used in conjunction with the method described above) of delivering a stream of processing fluid to the downward facing surface of the workpiece 25 is illustrated in FIGS. 10 and 11. In accordance with this latter method, reactor head 30 is driven to a fixed position within second processing portion 95 by the lift/rotate apparatus 50 under the direction of control system 55. A stream of processing fluid is provided through one or more nozzles 100. Control system 55 directs lift/rotate apparatus 50 to rotate reactor head 30 through a plurality of angles so that the stream of processing fluid 130 makes initial contact with the lower surface of workpiece 25 at a plurality of portions thereof sequentially as a function of time. Again, workpiece 25 may be spun at a high rotation rate to fling off spent processing fluid into the fluid channels 110 of the further collection system 105 as the stream of processing fluid 130 is delivered to the surface of workpiece 25. Rotation of the reactor head 30 and corresponding workpiece 25 may be executed in accordance with a controlled motion profile, such as a controlled continuous or variable rotation rate, between the starting and ending angular positions. Alternatively, the controlled motion profile may be in the form of discrete angular steps between the starting and ending angular positions.

FIGS. 10 and 11 illustrate starting and ending angular positions that may be employed, with FIG. 10 illustrating the starting angular position and FIG. 11 illustrating the ending angular position. In this illustrated embodiment, the stream of processing fluid 130 is initially directed to a central portion of the workpiece 25 as in FIG. 10. Reactor head 30 and the corresponding workpiece 25 are then rotated through one or more angular positions to reach the ending angular position shown in FIG. 11 in which the stream of processing fluid 130 is directed for initial contact with a peripheral portion of the workpiece 25.

Although, as noted above, the present invention is suitable for use in a wide range of microelectronic workpiece processes, it is particularly well-suited for use in microelectronic workpiece electroplating. After plating a wafer, the surface of the wafer that has been exposed to the plating solution is wetted with plating solution. The contact assembly and corresponding barrier seal are also wetted at the seal interface with the wafer. This condition is difficult to solve due to conflicting requirements. The wafer needs to remain wetted until the plating solution can be neutralized by deionized water or another neutralizer. The contact seal, on the other hand, needs the residual solution removed or dried to prevent migration of the plating solution to the sealed area, and ultimately behind it, during product removal. Simply drying this residual plating solution is not an option due to the corrosive/oxidizing effect drying has on the plated film. Such problems are addressed by rinsing the wafer and seal interface before the wafer is removed from then reactor. Also, it has been found to be desirable to occasionally rinse the seal and electrical contact in the absence of a wafer to assist in preventing a buildup of copper salts.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. An apparatus for processing a microelectronic workpiece, the apparatus comprising:

a workpiece support configured to hold the microelectronic workpiece;

a processing container configured to receive the microelectronic workpiece held by the workpiece support;

a drive mechanism connected to drive at least one of the processing container and the workpiece support holding the microelectronic workpiece relative to the other so that the microelectronic workpiece may be moved to a plurality of workpiece processing positions;

a first chemical delivery system providing at least one processing fluid to the processing container for application to the microelectronic workpiece when the microelectronic workpiece is in a first one of the plurality of workpiece processing positions;

a first chemical collector system configured to assist in at least partially removing spent processing fluid provided by the first chemical delivery system while the microelectronic workpiece is in the first one of the plurality of workpiece processing positions;

a second chemical delivery system providing at least one processing fluid to the processing container for application to the microelectronic workpiece when the microelectronic workpiece is in a second one of the plurality of microelectronic workpiece processing positions, the second chemical delivery system directing a spray of processing fluid for initial contact with the microelectronic workpiece at an initial radial position;

a second chemical collector system configured to assist in at least partially removing spent processing fluid provided by the second chemical delivery system from the processing container while the microelectronic workpiece is in the second one of the plurality of microelectronic workpiece processing positions; and a control system operatively coupled to the second chemical delivery system and the drive mechanism and being programmed with instructions that direct the drive mechanism to move the workpiece support during application of the spray from the second chemical delivery system so as to vary the radial position of the initial contact between the spray and the microelectronic workpiece.

2. The apparatus of claim 1, further comprising a rotor drive connected to spin the workpiece support.

3. The apparatus of claim 1 wherein the first one of the plurality of workpiece processing positions is at a first level within the processing container and the second one of the plurality of workpiece processing positions is at a second level within the processing container, the second level being above the first level.

4. The apparatus of claim 1 wherein the first chemical collector system is disposed at a level of the processing container corresponding to the first one of the plurality of workplace processing positions and the second chemical collector system is disposed at a different level of the processing container that corresponds to the second one of the plurality of workplace processing positions.

5. The apparatus of claim 1 wherein the second chemical collector system collects spent processing fluid as the spent processing fluid is flung from the microelectronic workpiece during spinning of the microelectronic workpiece.

6. The apparatus of claim 1 wherein the second chemical collector system comprises:

a splash wall extending about the interior periphery of the processing container;

a further wall extending about the interior periphery of the processing container;

the splash wall and further wall defining a collection channel therebetween for collecting the spent processing fluid of the second chemical delivery system.

7. The apparatus of claim 6, further comprising a fluid outlet proceeding from the collection channel.

8. The apparatus of claim 1 wherein the second chemical delivery system is configured to direct a spray of processing fluid that initially impinges on less than an entire radius of the microelectronic workpiece.

9. The apparatus of claim 1 wherein the second chemical delivery system directs a stream of the at least one processing fluid toward a fixed location.

10. An apparatus for processing a microelectronic workpiece, the apparatus comprising:

a workpiece support configured to hold the microelectronic workpiece;

a processing container configured to receive the microelectronic workpiece held by the workpiece support;

an automated drive system connected to drive at least one of the processing container and the workpiece support holding the microelectronic workpiece relative to the other so that the microelectronic workpiece is moved between an initial processing position and a secondary processing position;

a chemical delivery system providing at least one stream of at least one processing fluid to the processing container for application to at least one surface of the microelectronic workpiece as the microelectronic workpiece proceeds between the initial processing position and secondary processing position, the at least one stream being directed toward a first portion of the at least one surface of the microelectronic workpiece when the microelectronic workpiece is in the initial processing position, the at least one stream being directed toward a second portion of the at least one surface of the microelectronic workpiece disposed radially outwardly from the first portion, when the microelectronic workpiece is in the secondary processing position; and a control system operatively coupled to the chemical delivery system and the automated drive system and programmed with instructions that direct the drive system to move the workpiece support while the chemical delivery system directs the at least one stream toward the microelectronic workpiece.

11. The apparatus of claim 10 wherein the automated drive system includes a linear actuator that drives at least one of the processing container and the workpiece support relative to the other along a vertically oriented drive path.

12. The apparatus of claim 10 wherein the automated drive system includes a rotational actuator that drives at least one of the processing container and the workpiece support relative to the other along an angular drive path.

13. The apparatus of claim 10, further comprising a chemical collector system configured to remove spent processing fluid provided by the chemical delivery system as the microelectronic workpiece proceeds between the initial processing position and the secondary processing position.

14. The apparatus of claim 13, further comprising:

a further chemical delivery system configured to provide at least one processing fluid to the processing container for application to the microelectronic workpiece when the microelectronic workpiece is in a further processing position other than a position between the initial and secondary processing positions; and a further chemical collector system configured to assist in at least partially removing spent processing fluid provided by the further chemical delivery system from the processing container while the microelectronic workpiece is in the further workpiece processing position.

15. The apparatus of claim 13 wherein the chemical collector system comprises:

a splash wall extending about the interior periphery of the processing container;

a further wall extending about the interior periphery of the processing container;

the splash wall and further wall defining a collection channel therebetween for collecting the spent processing fluid of the further chemical delivery system.

16. The apparatus of claim 10, further comprising a rotor drive connected to spin the workpiece support and corresponding microelectronic workpiece as the microelectronic workpiece proceeds from the initial processing position to the secondary processing position.

17. The apparatus of claim 10, wherein the chemical delivery system is configured to direct a stream of processing fluid that initially impinges on less than an entire radius of the microelectronic workpiece.

18. An apparatus for processing a microelectronic workpiece, the apparatus comprising:
- a workpiece support configured to hold the microelectronic workpiece;
- a processing container configured to receive the microelectronic workpiece held by the workpiece support, the processing container being configured for immersion processing of at least one surface of the microelectronic workpiece at a first processing portion of the processing container, and configured for spray processing the at least one surface of the microelectronic workpiece at a second processing portion of the processing container;
- a drive mechanism connected to drive at least one of the processing container and the workpiece support holding the microelectronic workpiece relative to the other so that the microelectronic workpiece may be moved to a plurality of workpiece processing positions, the plurality of workpiece processing positions including at least an immersion processing position proximate the first portion of the processing container and a spray processing position proximate the second portion of the processing container;
- a first chemical delivery system configured to provide at least one processing fluid to the processing container for immersion processing of the at least one surface of the microelectronic workpiece when the microelectronic workpiece is at the immersion processing position;
- a first chemical collector system configured to assist in at least partially removing spent processing fluid provided by the first chemical delivery system while the microelectronic workpiece is at the immersion processing position;
- a second chemical delivery system configured to provide at least one processing fluid to the processing container for spray processing of the at least one surface of the microelectronic workpiece when the microelectronic workpiece is at the spray processing position, the second chemical delivery system being positioned to direct a spray of processing fluid for initial contact with the microelectronic workpiece at an initial radial position;
- a second chemical collector system configured to assist in at least partially removing spent processing fluid provided by the second chemical delivery system from the processing container while the microelectronic workpiece is at the spray processing position; and
- a control system operatively coupled to the second chemical delivery system and the drive mechanism and programmed with instructions that direct the drive mechanism to move the workpiece support during application of the spray from the second chemical delivery system so as to vary the radial position of the initial contact between the spray and the microelectronic workpiece.

19. The apparatus of claim 18 wherein the first processing portion of the processing container is below the second processing portion of the processing container.

20. The apparatus of claim 18, further comprising a rotor drive connected to spin the workpiece support.

21. The apparatus of claim 18 wherein the immersion processing position is at a first level within the processing container and the spray processing position is at a second level within the processing container, the second level being above the first level.

22. The apparatus of claim 18 wherein the second chemical collector system collects spent processing fluid as the spent processing fluid is flung from the microelectronic workpiece during spinning of the microelectronic workpiece.

23. The apparatus of claim 22 wherein the second chemical collector system comprises:
- a splash wall extending about the interior periphery of the processing container;
- a further wall extending about the interior periphery of the processing container;
- the splash wall and further wall defining a collection channel therebetween for collecting the spent processing fluid of the second chemical delivery system.

24. The apparatus of claim 23, further comprising a fluid outlet proceeding from the collection channel.

25. The apparatus of claim 18 wherein the drive mechanism comprises a linear actuator and wherein the control system directs the linear actuator to drive the microelectronic workpiece along a vertically oriented linear drive path between the immersion processing position and the spray processing position.

26. The apparatus of claim 18 wherein the drive mechanism comprises a rotational actuator and wherein the control system directs the rotational actuator to rotate the microelectronic workpiece along an angular drive path about a fixed rotation axis between the immersion processing position and the spray processing position.

27. An apparatus for processing a microelectronic workpiece, comprising:
- a workpiece support configured to hold a microelectronic workpiece;
- a processing vessel configured to receive a microelectronic workpiece held by the workpiece support;
- a drive system coupled to the workpiece support to move the workpiece support along a first axis relative to the processing vessel between a first position and a second position, the drive system being configured to tilt the workpiece support relative to the vessel about a second axis generally transverse to the first axis;
- a fluid delivery system positioned to direct at least one stream of processing fluid toward the workpiece support to impinge on a microelectronic workpiece while the workpiece support holds the microelectronic workpiece; and
- a control system operatively coupled to the drive system to direct the drive system to move the workpiece support while the fluid delivery system directs the at least one stream of processing fluid, wherein the control system directs the drive system to drive the microelectronic workpiece between the first position and the second position as the fluid delivery system provides the at least one stream of processing fluid for contact with at least one surface of the microelectronic workpiece, the at least one stream being directed toward a first portion of the at least one surface of the microelectronic workpiece when the microelectronic workpiece is in the first position, the at least one stream being directed toward a second portion of the at least one surface of the microelectronic workpiece disposed radially outwardly from the first position, when the microelectronic workpiece is in the second position.

28. The apparatus of claim 27, further comprising:
a fluid collector system; and
a rotor drive connected to spin the workpiece support and corresponding microelectronic workpiece to thereby fling spent processing fluid into the fluid collector system.

29. The apparatus of claim 27, further comprising a fluid collector system that includes:
a splash wall extending about the interior periphery of the processing vessel;
a further wall extending about the interior periphery of the processing vessel;
the splash wall and further wall defining a collection channel therebetween for collecting the spent processing fluid of the fluid delivery system.

30. The apparatus of claim 29, further comprising a fluid outlet proceeding from the collection channel.

31. The apparatus of claim 27 wherein the drive system comprises a linear actuator and wherein the control system directs the linear actuator to drive the microelectronic workpiece along a vertically oriented linear drive path between the first position and the second position.

32. An apparatus for processing a microelectronic workpiece, comprising:
a workpiece support configured to hold the microelectronic workpiece;
a processing container configured to receive the microelectronic workpiece held by the workpiece support;
a drive mechanism connected to drive at least one of the processing container and the workpiece support relative to the other to move the microelectronic workpiece to at least one processing position;
a fluid delivery system positioned to direct a spray of a processing fluid to the processing container for application to the microelectronic workpiece when the microelectronic workpiece is in the at least one workpiece processing position; and
a collector system positioned to receive at least a portion of the processing fluid directed by the fluid delivery system, the collector system including a first annular channel and a second annular channel positioned at least proximate to the first annular channel, the first and second annular channels being in fluid communication with each other via a common outlet.

33. The apparatus of claim 32 wherein the first and second annular channels are disposed concentrically about an axis, and wherein the workpiece support is rotatable relative to the container about the axis.

34. The apparatus of claim 32 wherein at least one of the annular channels is bounded by a first wall and a second wall, with at least part of the second wall positioned radially outwardly from the first wall.

35. The apparatus of claim 32 wherein the first annular channel is bounded by a first wall and a second wall, with at least part of the second wall positioned radially outwardly from the first wall, and wherein the second annular channel is bounded by the second wall and a third wall, with at least part of the third wall positioned radially outwardly from the second wall.

36. The apparatus of claim 32 wherein the second annular channel is positioned above the first annular channel.

37. The apparatus of claim 32 wherein the first and second annular channels are concentric about an axis and wherein the first annular channel has a first axial position relative to the axis and the second annular channel has a second axial position relative to the axis, the second axial position being different than the first axial position.

38. The apparatus of claim 32, further comprising a control system operatively coupled to the drive mechanism and programmed to direct the drive mechanism to move the workpiece support during application of the spray from the delivery system so as to vary the radial position of an initial contact between the spray and the microelectronic workpiece.

39. The apparatus of claim 32 wherein the workpiece support is movable relative to the container along an axis to a plurality of processing positions, and wherein at least one of the annular channels is bounded by a first wall and a second wall, with at least part of the second wall disposed radially outwardly from the first wall, and wherein the first and second walls are disposed obliquely relative to the axis.

40. An apparatus for processing a microelectronic workpiece, comprising:
a workpiece support configured to hold the microelectronic workpiece;
a processing container configured to receive the microelectronic workpiece held by the workpiece support;
a drive mechanism connected to drive at least one of the processing container and the workpiece support relative to the other to move the microelectronic workpiece to a plurality of processing positions;
a first fluid delivery system positioned to provide at least one processing fluid to the processing container for application to the microelectronic workpiece when the microelectronic workpiece is in a first one of the plurality of workpiece processing positions;
a first fluid collector system positioned to receive at least a portion of the processing fluid provided by the first fluid delivery system while the microelectronic workpiece is in the first one of the plurality of workpiece processing positions;
a second fluid delivery system positioned to direct a spray of at least one processing fluid to the processing container for application to the microelectronic workpiece when the microelectronic workpiece is in a second one of the plurality of microelectronic workpiece processing positions;
a second fluid collector system positioned to receive at least a portion of the processing fluid directed by the second fluid delivery system while the microelectronic workpiece is in the second one of the plurality of microelectronic workpiece processing positions, the second fluid collector including a first annular channel and a second annular channel positioned at least proximate to the first annular channel, the first and second annular channels being in fluid communication with each other via a common outlet.

41. The apparatus of claim 40 wherein the first and second annular channels are disposed concentrically about an axis, and wherein the workpiece support is rotatable relative to the container about the axis.

42. The apparatus of claim 40 wherein at least one of the annular channels is bounded by a first wall and a second wall, with at least part of the second wall positioned radially outwardly from the first wall.

43. The apparatus of claim 40 wherein the first annular channel is bounded by a first wall and a second wall, with at least part of the second wall positioned radially outwardly from the first wall, and wherein the second annular channel is bounded by the second wall and a third wall, with at least part of the third wall positioned radially outwardly from the second wall.

44. The apparatus of claim 40 wherein the second annular channel is positioned above the first channel.

45. The apparatus of claim 40 wherein the first and second annular channels are concentric about an axis and wherein the first annular channel has a first axial position relative to the axis and the second annular channel has a second axial position relative to the axis, the second axial position being different than the first axial position.

46. The apparatus of claim 40, further comprising a control system operatively coupled to the drive mechanism and configured to direct the drive mechanism to move the workpiece support during application of the spray from the second delivery system so as to vary the radial position of an initial contact between the spray and the microelectronic workpiece.

47. The apparatus of claim 40 wherein the workpiece support is movable relative to the container along an axis to a plurality of processing positions, and wherein at least one of the annular channels is bounded by a first wall and a second wall, with at least part of the second wall disposed radially outwardly from the first wall, and wherein the first and second walls are disposed obliquely relative to the axis.

* * * * *

UNITED STATES PATENT AND TRADEMARK OFFICE
CERTIFICATE OF CORRECTION

PATENT NO. : 6,854,473 B2
DATED : February 15, 2005
INVENTOR(S) : Kyle M. Hanson et al.

It is certified that error appears in the above-identified patent and that said Letters Patent is hereby corrected as shown below:

Column 1,
Line 32, "after" should be -- alter --;

Signed and Sealed this

Twenty-eighth Day of June, 2005

JON W. DUDAS
*Director of the United States Patent and Trademark Office*

UNITED STATES PATENT AND TRADEMARK OFFICE
CERTIFICATE OF CORRECTION

PATENT NO.    : 6,854,473 B2
DATED         : February 15, 2005
INVENTOR(S)   : Kyle M. Hanson et al.

It is certified that error appears in the above-identified patent and that said Letters Patent is hereby corrected as shown below:

Column 18,
Line 34, "then" should be -- the --.

Signed and Sealed this

Sixth Day of September, 2005

JON W. DUDAS
*Director of the United States Patent and Trademark Office*